United States Patent
Uzoh et al.

(10) Patent No.: US 9,812,360 B2
(45) Date of Patent: *Nov. 7, 2017

(54) SYSTEMS AND METHODS FOR PRODUCING FLAT SURFACES IN INTERCONNECT STRUCTURES

(71) Applicant: Tessera, Inc., San Jose, CA (US)

(72) Inventors: Cyprian Uzoh, San Jose, CA (US); Vage Oganesian, Palo Alto, CA (US); Ilyas Mohammed, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/391,393

(22) Filed: Dec. 27, 2016

(65) Prior Publication Data

US 2017/0110370 A1    Apr. 20, 2017

Related U.S. Application Data

(60) Continuation of application No. 15/066,238, filed on Mar. 10, 2016, now Pat. No. 9,558,998, which is a continuation of application No. 14/814,344, filed on Jul. 30, 2015, now Pat. No. 9,318,385, which is a continuation of application No. 14/199,181, filed on Mar. 6, 2014, now Pat. No. 9,123,703, which is a division of application No. 13/168,839, filed on Jun. 24, 2011, now Pat. No. 8,728,934.

(51) Int. Cl.
*H01L 21/44* (2006.01)
*H01L 21/768* (2006.01)
*H01L 23/48* (2006.01)
*H01L 23/532* (2006.01)

(52) U.S. Cl.
CPC .... *H01L 21/76898* (2013.01); *H01L 21/7684* (2013.01); *H01L 21/76852* (2013.01); *H01L 23/481* (2013.01); *H01L 23/53238* (2013.01)

(58) Field of Classification Search
None
See application file for complete search history.

(56) References Cited

U.S. PATENT DOCUMENTS 6,376,376 B1    4/2002    Lim et al.
6,417,093 B1    7/2002    Xie
(Continued)

FOREIGN PATENT DOCUMENTS

JP    2000124216    4/2000
JP    2000188293    7/2000
(Continued)

*Primary Examiner* — Robert Bachner
(74) *Attorney, Agent, or Firm* — Haynes and Boone, LLP

(57) ABSTRACT

In interconnect fabrication (e.g. a damascene process), a conductive layer is formed over a substrate with holes, and is polished to provide interconnect features in the holes. To prevent erosion/dishing of the conductive layer at the holes, the conductive layer is covered by a sacrificial layer (possibly conformal) before polishing; then both layers are polished. Initially, before polishing, the conductive layer and the sacrificial layer are recessed over the holes, but the sacrificial layer is polished at a lower rate to result in a protrusion of the conductive layer at a location of each hole. The polishing can continue to remove the protrusions and provide a planar surface.

23 Claims, 7 Drawing Sheets

(56) References Cited

U.S. PATENT DOCUMENTS

| | | |
|---|---|---|
| 6,447,695 B1 | 9/2002 | Motonari et al. |
| 6,551,935 B1 | 4/2003 | Sinha et al. |
| 6,555,477 B1 | 4/2003 | Lu et al. |
| 6,663,469 B2 | 12/2003 | Kimura et al. |
| 6,676,484 B2 | 1/2004 | Chopra |
| 6,946,397 B2 | 9/2005 | Hong et al. |
| 7,291,557 B2 | 11/2007 | Wan et al. |
| 7,585,760 B2 | 9/2009 | Andryushchenko et al. |
| 7,633,165 B2 | 12/2009 | Hsu et al. |
| 7,633,175 B1 | 12/2009 | Wilson, III et al. |
| 8,193,615 B2 | 6/2012 | Haba |
| 8,278,214 B2 | 10/2012 | Roy |
| 2002/0068435 A1 | 6/2002 | Tsai et al. |
| 2002/0146965 A1 | 10/2002 | Thomas et al. |
| 2002/0151167 A1 | 10/2002 | Farkas et al. |
| 2002/0192940 A1 | 12/2002 | Lee et al. |
| 2004/0009659 A1 | 1/2004 | Kim |
| 2004/0023607 A1 | 2/2004 | Talieh et al. |
| 2004/0147116 A1 | 7/2004 | Chen et al. |
| 2004/0173464 A1 | 9/2004 | Parikh et al. |
| 2004/0192940 A1 | 9/2004 | Huang et al. |
| 2004/0229457 A1 | 11/2004 | Chan et al. |
| 2006/0057841 A1* | 3/2006 | Wan .................... H01L 21/7684 438/634 |
| 2008/0233745 A1 | 9/2008 | Chang et al. |
| 2008/0242089 A1 | 10/2008 | Zinn et al. |
| 2009/0269507 A1* | 10/2009 | Yu .................... H01L 21/02074 427/535 |

FOREIGN PATENT DOCUMENTS

| | | |
|---|---|---|
| JP | 2003115488 | 4/2003 |
| WO | 02073681 A1 | 9/2002 |

* cited by examiner

PRIOR ART

SYSTEMS AND METHODS FOR PRODUCING FLAT SURFACES IN INTERCONNECT STRUCTURES

CROSS-REFERENCE TO RELATED APPLICATIONS

This application is a continuation of U.S. patent application Ser. No. 15/066,238, filed Mar. 10, 2016, incorporated herein by reference, which is a continuation of U.S. patent application Ser. No. 14/814,344, filed Jul. 30, 2015, incorporated herein by reference, which is a continuation of U.S. patent application Ser. No. 14/199,181, filed Mar. 6, 2014, incorporated herein by reference, now U.S. Pat. No. 9,123,703, which is a division of U.S. patent application Ser. No. 13/168,839, filed Jun. 24, 2011, titled "SYSTEMS AND METHODS FOR PRODUCING FLAT SURFACES IN INTERCONNECT STRUCTURES", incorporated herein by reference, now U.S. Pat. No. 8,728,934.

INCORPORATION BY REFERENCE

All publications, including patents and patent applications, mentioned, in this specification are herein incorporated by reference in their entirety to the same extent as if each individual publication was specifically and individually indicated to be incorporated by reference.

FIELD OF THE INVENTION

The present invention relates generally to semiconductor device and methods pertaining to their manufacture. More specifically, the present invention relates to devices and methods for reducing/eliminating dishing defects in interconnect structures.

BACKGROUND OF THE INVENTION

Semiconductor chips are fabricated on suitable flat substrate wafers, such as GaAs, diamond coated substrates, silicon carbide, silicon wafers, etc. After making the active devices, a series of steps are performed to connect the various devices with highly conducting wiring structures, so they can have communication with each other to perform logic operations. These wiring structures or interconnect structures are essentially a skeletal network of conducting materials, typically metals in a matrix of dielectric materials. In high performance devices and to improve device density and yield, it is imperative to minimize topographic features within the interconnect layers for any given device and across the entire substrate. One common method of forming these high performance interconnect layers is the damascene process.

Multiple types of damascene structures are known, however the single and dual damascene are the most common. In single damascene, each metal or via layer is fabricated in a series of operations, while in dual damascene, a metal level and a via level are fabricated in a similar operation. Of these two, the dual damascene step is often preferred because of lower cost and higher device performance.

In the dual damascene process, a suitable substrate with or without devices is coated with a suitable resist layer. The resist layer is imaged to define desirable patterns by lithographic methods on the substrate. Cavities are etched on the patterned substrates typically by reactive ion etching methods, RIE. The patterned substrate is then coated with a suitable barrier/seed layer prior to overfilling the cavities with a suitable metal, typically copper by electro-deposition from a superfilling plating bath chemistry.

The damascene process is repeated to form the many layers of interconnect. As a result of the discontinuity in the properties (difference in mechanical properties, polishing rates, etc) of the metal and insulator, and their respective interactions with the polishing pad, polishing slurry, and other process parameters produces erosion in high metal pattern density features and dishing in large metal structures. The higher the metal pattern density, the higher the erosion, similarly, the larger the size of the metal cavity, the worse the gravity of the dishing defect. These deleterious defects cause shorting defects in subsequent levels, reducing device yield.

Similar results are observed in cross section topographic profiles of polished TSV structures. The center of the vias are typically lower than the surface of the insulators.

One of the consequences of dishing in the interconnect structures is poor flatness of the conductor and much higher pressures are typically needed to bond devices to the dished substrate or for wafer to wafer bonding. One method used to improve wafer to wafer bonding is to selectively recess the dielectric layer, so that the copper structures are protruding above the insulator surface prior to the bonding operation. This operation adds additional cost to the technology and is a source of defect when not properly implemented. Also, the poor flatness on the conductor surface often produces defect bonds, when the said surface is bonded or attached to other devices or substrates.

Other attempts to reduce the impact of these defects have lead to the incorporation of dummy dielectric features within large copper structures in dual damascene feature for chip interconnects. This approach has been helpful, but it has also increased mask design complexity and the associated loss of freedom of structure placement on the modified pads.

SUMMARY OF THE DISCLOSURE

In one embodiment, a method of forming a semiconductor interconnect structure is provided, comprising forming a cavity in a substrate, depositing a barrier layer on the cavity and on a first surface of the substrate, depositing a conductor on the barrier layer and inside the cavity, depositing a conductive sacrificial layer on the conductor, and removing portions of the conductive sacrificial layer, the conductor, and the barrier layer from the first surface until the conductor inside the cavity is angled greater than or equal to zero with respect to the first surface of the substrate.

In some embodiments, the removing step comprises removing portions of the conductive sacrificial layer, the conductor, and the barrier layer until the conductor inside the cavity comprises a planar surface that is coplanar with the first surface of the substrate. In other embodiments, the removing step comprises removing portions of the conductive sacrificial layer, the conductor, and the barrier layer until the conductor inside the cavity comprises a substantially convex surface that extends above the first surface of the substrate.

In one embodiment of the method, the conductor comprises copper.

In an additional embodiment, the removing step comprises a chemical mechanical polishing process. In another embodiment, the removing step comprises an ECMP process.

In some embodiments of the method, the depositing a conductive sacrificial layer step further comprises electrolessly or electrolytically depositing a conductive sacrificial layer on the conductor.

In one embodiment, a corrosion rate of the conductive sacrificial layer is less than a corrosion rate of the conductor. In another embodiment, a polishing rate of the conductive sacrificial layer is less than a polishing rate of the conductor.

In some embodiments, the conductive sacrificial layer comprises a material selected from the group of Ni, Ni alloys, NiP, NiB, NiW, NiWB, NiCoP, NiMoP, NiGa nickel-tungsten, cobalt alloys, CoP, CoWP, CMoP, copper alloys, copper-tungsten, Cu—Ga, and Cu—In.

In additional embodiments of the method, the depositing a conductive sacrificial layer step further comprises depositing a conductive sacrificial layer having a thickness ranging from approximately 3 nm to 300 nm on the conductor. Alternatively in another embodiment, the depositing a conductive sacrificial layer step further comprises depositing a conductive sacrificial layer having a thickness ranging from approximately 5 nm to 50 nm on the conductor. In some embodiments, the conductive sacrificial layer comprises a conformal layer. In another embodiment, the conductive sacrificial layer comprises an electroplated metal.

Another method of forming a semiconductor device is provided, comprising depositing a barrier layer on a substrate comprising at least one cavity, depositing a conductor on the barrier layer to overfill the at least one cavity, depositing a conductive sacrificial layer on the conductor, and removing the conductive sacrificial layer, the conductor, and the barrier layer from portions of the substrate adjacent to the at least one cavity to form an interconnect structure.

In some embodiments, the interconnect structure comprises a flat surface that is co-planar with a top surface of the substrate. In other embodiments, the interconnect structure comprises a top surface that angles upwards from a first surface of the substrate.

In some embodiments, the interconnect structure comprises a damascene structure. In other embodiments, the interconnect structure comprises a through-silicon via structure or interposer.

In one embodiment of the method, the removing the conductive sacrificial layer step further comprises removing the conductive sacrificial layer, the conductor, and the barrier layer or adhesion, layer or coupling layer from portions of the substrate adjacent to the at least one cavity until the conductor within the interconnect structure forms a substantially convex surface.

In another embodiment of the method, the removing the conductive sacrificial layer step further comprises removing the conductive sacrificial layer, the conductor, and the barrier layer from portions of the substrate adjacent to the at least one cavity until the conductor within the cavity forms a flat surface.

Another method of forming a semiconductor interconnect structure is provided, comprising forming a cavity in a substrate, depositing a barrier layer on the cavity and on a first surface of the substrate, depositing a conductor on the barrier layer, or adhesion layer or coupling layer inside the cavity, depositing a conductive sacrificial layer on the conductor, and removing portions of the conductive sacrificial layer, the conductor, and the barrier layer from the first surface until the conductor inside the cavity comprises a planar surface that is coplanar with the first surface of the substrate.

A semiconductor structure is also provided, comprising a substrate, and an interconnect structure disposed on the substrate, the interconnect structure having a top planar surface that is coplanar with the substrate.

In some embodiments, the interconnect structure comprises a damascene structure. In other embodiments, the interconnect structure comprises a TSV structure. In other embodiments, the substrate is an interposer. In one embodiment, the substrate and structure is a flat display panel.

DETAILED DESCRIPTION OF THE INVENTION

Figure 1A:
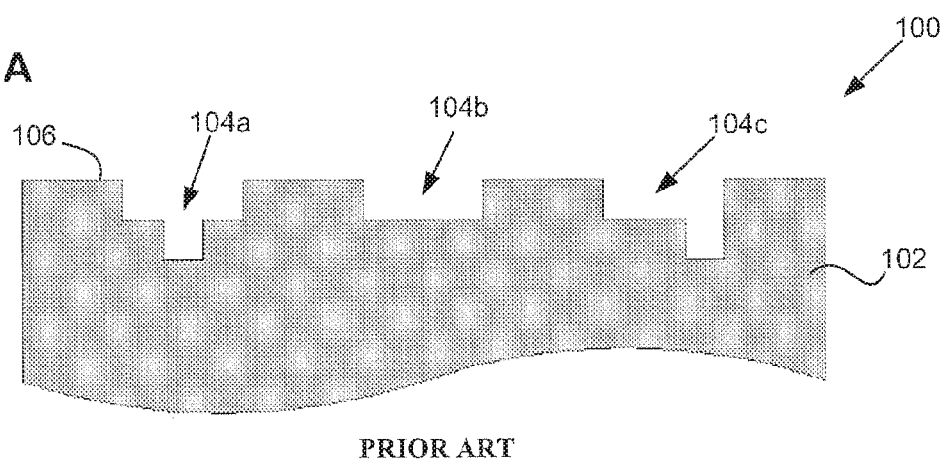
FIGS. 1A-1F illustrate one method of forming a semiconductor interconnect structure.

FIGS. 1A-1F illustrate a conventional method and approach for forming a damascene structure on a semiconductor device 100. FIG. 1A illustrates a substrate 102 having cavities 104a, 104b, and 104c formed in the substrate below a top or first surface 106 of the substrate. The cavities can be formed by any process known in the art, such as by coating the substrate with a suitable resist layer, imaging the resist layer to define lithographic patterns on the substrate, and etching the cavities on the patterned substrate, such as with a reactive ion etching (RIE) method. The substrate can comprise any suitable wiring substrate, semiconductor, or non-semiconductor substrate used in devices, packages, or flat panels. Such substrate can be, for example, wafers, silicon wafers, glass, glass ceramic, ceramics, sapphire, interposer substrate, or wiring boards, for example. FIG. 1A illustrates the formation of both single damascene (104b) and dual damascene (104a and 104c) structures.

Figure 1B:
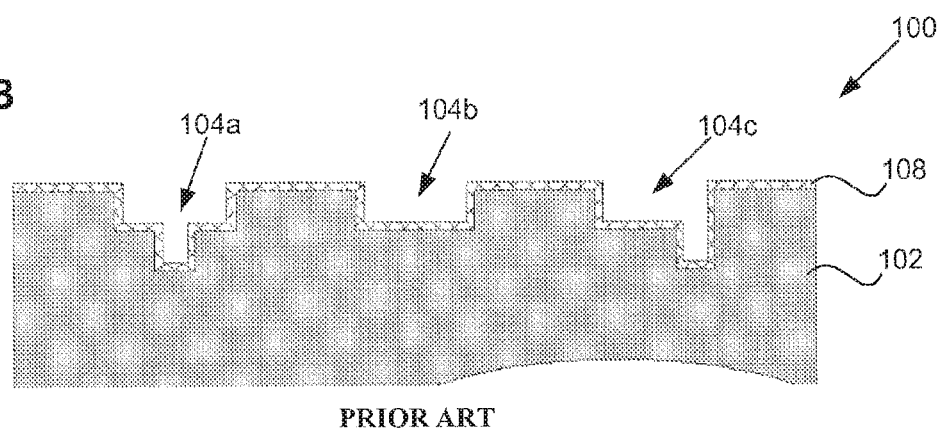
Figure 1C:
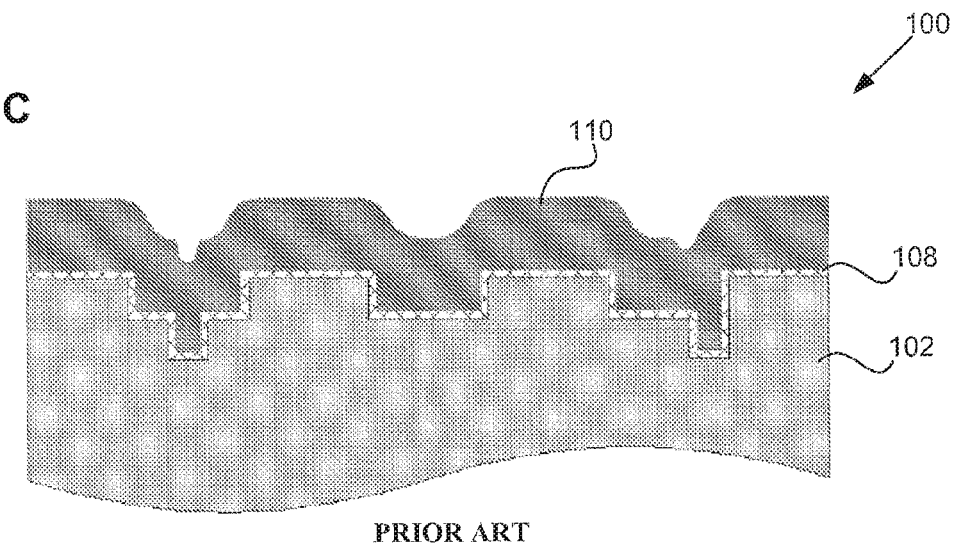

Referring to FIG. 1B, a barrier/seed layer, or a platable adhesion or coupling layer 108 can be deposited on the substrate, including on the top surface of the substrate and on the side and bottom walls of cavities 104a-104c. After application of the barrier/seed layer, a conductor 110 can be deposited on the barrier/seed layer 108 to overfill the cavities, as shown in FIG. 1C. In one embodiment, the conductor comprises copper and is deposited on the barrier layer and inside the cavities by electro-deposition from a superfilling plating bath chemistry. In other embodiments, the conductor comprises aluminum, nickel, tungsten, copper tungsten alloy.

Figure 1D:
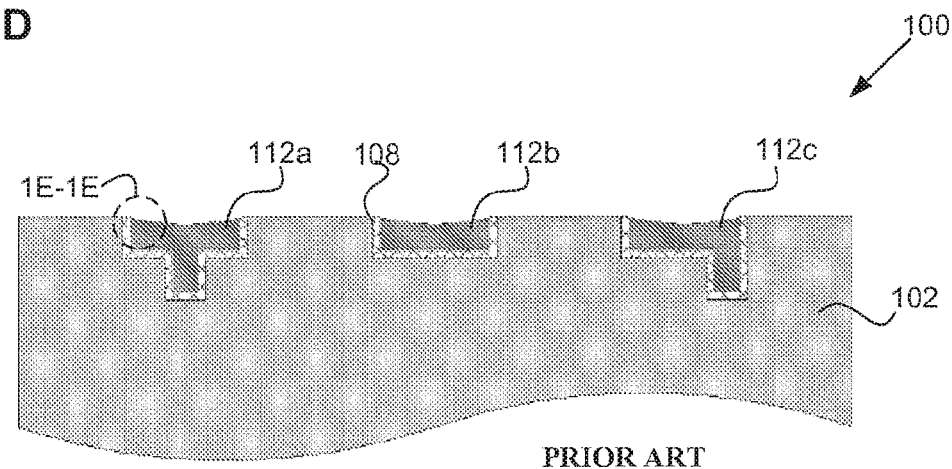

Next, the conductor coated substrate can be removed/polished to remove excess conductor and barrier/seed layer from the semiconductor device. In some embodiments, this process is achieved with a chemical-mechanical polishing (CMP) or electro-chemical-mechanical polishing (ECMP) device. FIG. 1D illustrates the remaining conductor portions as interconnect structures 112a-112e within the cavities (e.g., within cavities 104a-104c), after the removing or polishing step. It should be noted that in the conventional interconnect formation process described thus far, the interconnect structures, as shown in FIG. 1D, comprise concave or "dished" top surfaces. More specifically, the conductor dips or curves down from the edge of the substrate into the cavity.

Figure 1E:
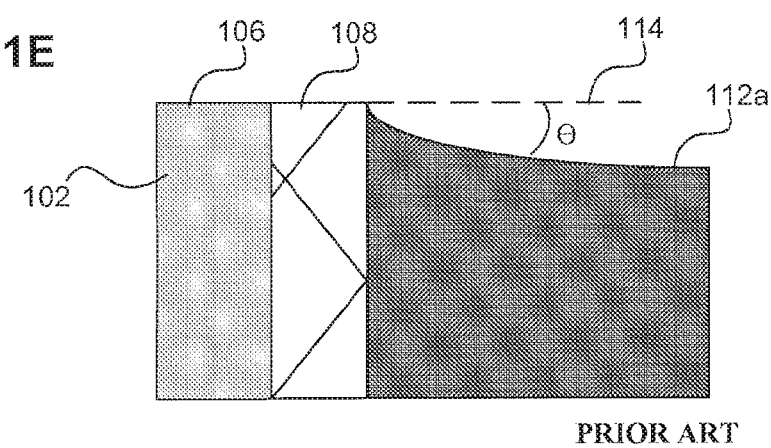

FIG. 1E illustrates a close-up view of interconnect structure 112a from FIG. 1D contained within circle 1E-1E, and more clearly shows the dishing described above in FIG. 1D. Referring to FIG. 1E, it is clear that the interconnect structure 112a dishes or curves downward from interface between the barrier layer 108 and the substrate 102. This is further illustrated by referencing imaginary dashed line 114, which extends from top surface 106 of the substrate 102. As shown by angle θ, the surface of the conductor inside the cavity is angled less than zero with respect to the first or top surface 106 of the substrate 102. Generally speaking, the center of the interconnect structures are recessed to be lower than the top surface of the substrate and lower than the edges of the interconnect structures.

Figure 1F:
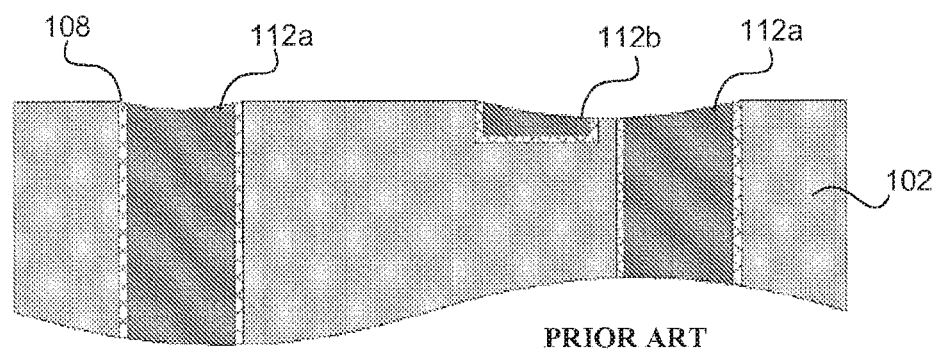

In an alternative embodiment, FIG. 1F illustrates dishing defects of interconnect structures 112a-112c in through-silicon via (TSV) structures. The formation of the TSV structures with a substrate 102, cavities, a barrier layer 108, and interconnect structures 112a-112c can be similar to as described above with respect to the damascene process.

Figure 2A:
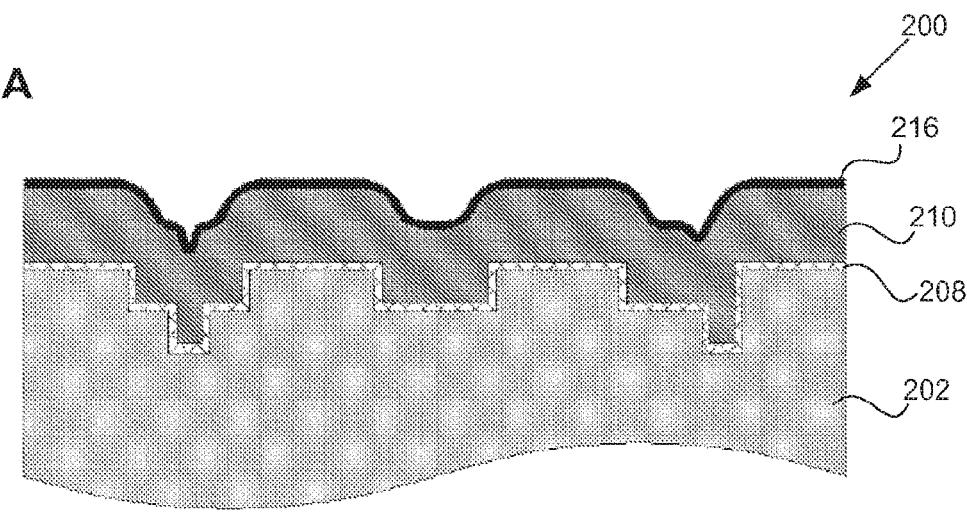
FIGS. 2A-2G illustrate another method of forming a semiconductor interconnect structure.

A method of reducing or eliminating dishing defects on substrates will now be described. Referring now to FIG. 2A, a semiconductor device 200 comprises a suitable substrate 202, barrier/seed layer 208, and conductor 210. As shown in the figure, the barrier/seed layer and the conductor are both deposited in cavities formed in the substrate. The methods of forming the cavities and depositing the barrier/seed and conductor layers can be the same as they are described above with respect to FIGS. 1A-1C.

In contrast to the conventional approach, the present method further includes the step of depositing a conductive sacrificial layer 216 on the conductor 210 prior to the removing/polishing step. In one embodiment of this invention, the sacrificial material is coated on the conductor material after the gap filling process. In another embodiment, the sacrificial material is coated over the conductor after thermal treatment of the conductor to stabilize the grain size or structure of the coated conductor.

Referring again to FIG. 2A, the conductive sacrificial layer 216 can be a material dissimilar to the conductor 210 upon which it is deposited. For example, in embodiments where the conductor 210 comprises copper, the conductive sacrificial layer 216 can comprise any conductive material except for copper.

In some embodiments, a corrosion rate or dissolution/polishing rate of the conductive sacrificial layer 216 is lower than that of the conductor 210. In other embodiments, the conductive sacrificial layer 216 can be electrolessly deposited on the conductor 210. In additional embodiments, the conductive sacrificial layer 216 can comprise Ni, Ni alloys, NiP, NiB, NiW, NiWB, NiCoP, NiMoP, NiGa nickel-tungsten, cobalt alloys, copper-tungsten, CoP, CoWP, CMoP, or any other similar suitable materials. In yet another embodiment, the conductive sacrificial layer can have a thickness ranging from approximately 3 nm to 300 nm on the conductor, or more specifically, can have a thickness ranging from approximately 5 nm to 50 nm on the conductor. In another embodiment, the conductive sacrificial layer can comprise a low dielectric constant material. In other embodiments, the conductive sacrificial layer comprises a conformal layer, or an electroplated metal. In other embodiments, more than one sacrificial layer may be coated.

Figure 2B:
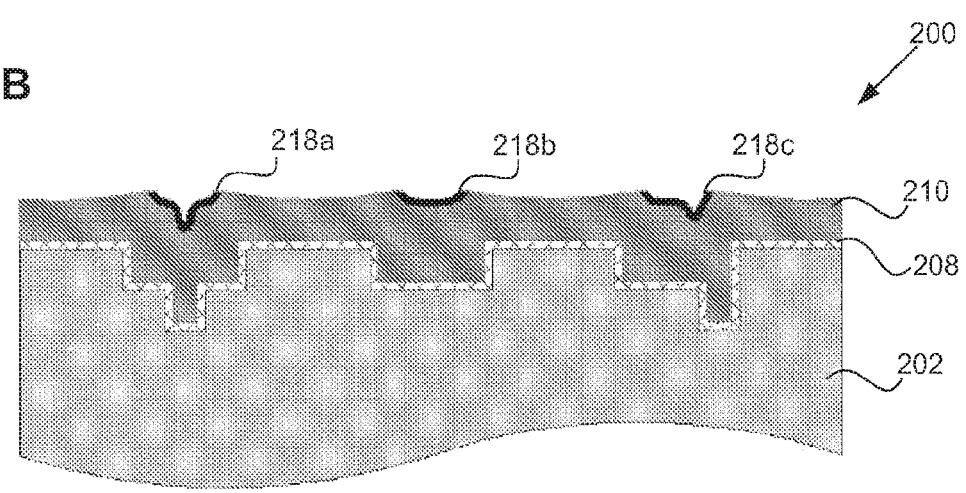
Figure 2C:
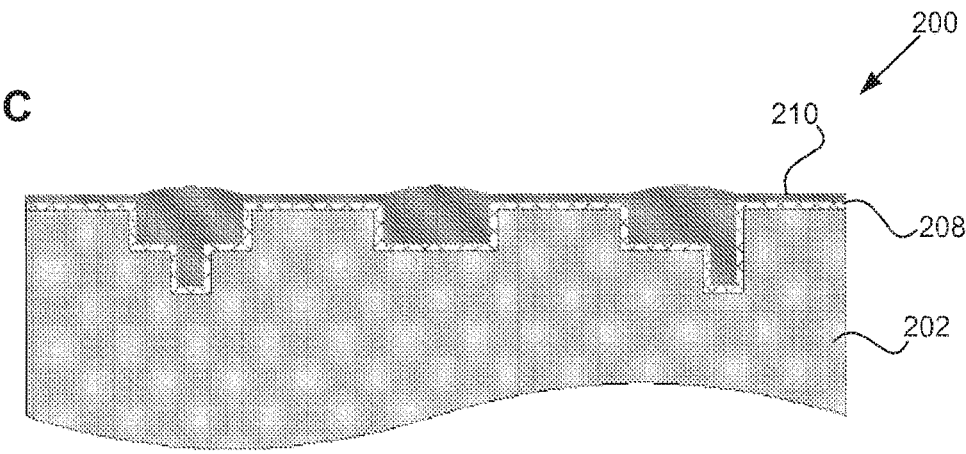

After depositing the conductive sacrificial layer on the conductor, portions of the conductive sacrificial layer 216, the conductor 210, and the barrier layer 208 can be removed or polished, such as with a CMP or ECMP process. FIG. 2B illustrates the semiconductor device 200 after an intermediate polish with a CMP machine. In FIG. 213, only portions of the conductive sacrificial layer remain, illustrated as portions 218a, 218b, and 218c. Also shown, some portions of the conductor 210 have been polished away. FIG. 2C illustrates the semiconductor device 200 after additional polishing. In FIG. 2C, a thin layer of conductor 210 still remains over the barrier layer 208, and the portions of the conductor over the cavities resemble a convex or domed surface, as shown. The conductive sacrificial layer has been completely removed by this stage in the process.

Figure 2D:
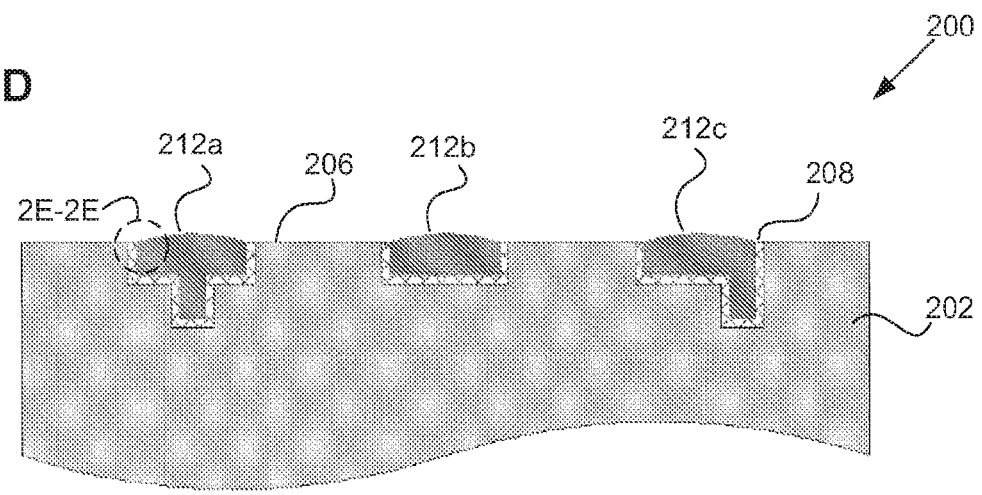

Further polishing/removing of portions of the conductive sacrificial layer is illustrated in FIG. 2D. As illustrated, portions of the conductive sacrificial layer, the conductor, and the barrier layer have been removed from the top surface of the substrate so that the conductor inside each of the cavities (e.g., interconnect structures 212a, 212b, and 212c) each resemble a convex surface that extends above the top surface 206 of the substrate. In FIG. 2D, the conductive sacrificial layer, the conductor, and the barrier layer have been removed from portions of the substrate adjacent to each of the interconnect structures.

Figure 2E:
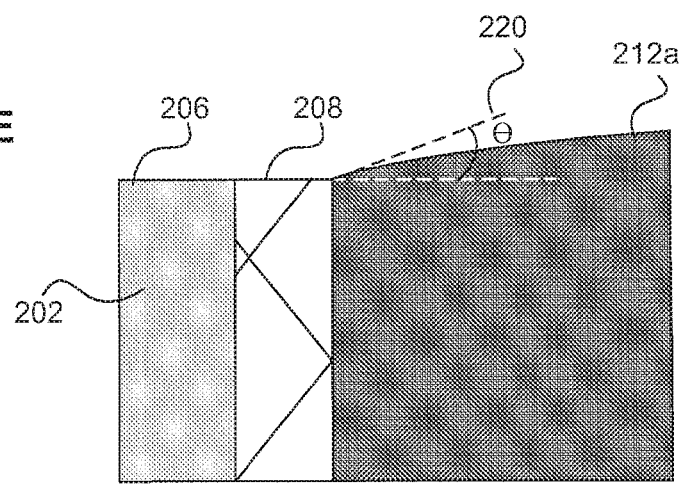

FIG. 2E illustrates a close-up view of the interconnect structure 212a from FIG. 2D contained within circle 2E-2E, and more clearly shows the domed or upwardly curved surface described above in FIG. 2D. Referring to FIG. 2E, it is clear that the interconnect structure 212a curves upward from the interface between the barrier layer 208 and the substrate 202. This is further illustrated by referencing imaginary dashed line 220, which is angled upwards from top surface 206 of the substrate 202. As shown by angle θ, the surface of the conductor inside the cavity is angled upwards greater than zero with respect to the first or top surface 206 of the substrate 202. Generally speaking, the center of the interconnect structures are raised to be higher than the top surface of the substrate. The interconnect structures formed and illustrated in FIGS. 2D-2E can be any type of damascene interconnect structure, such as a single or dual damascene structure.

Figure 2F:
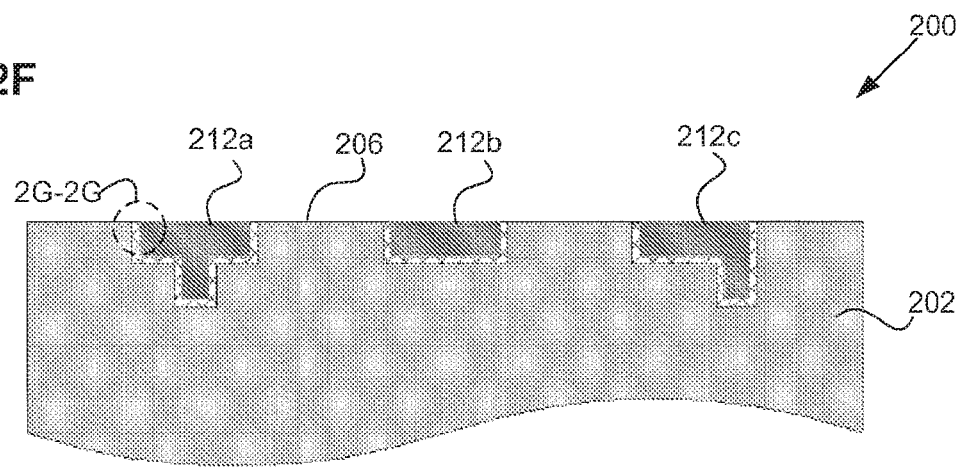
Figure 2G:
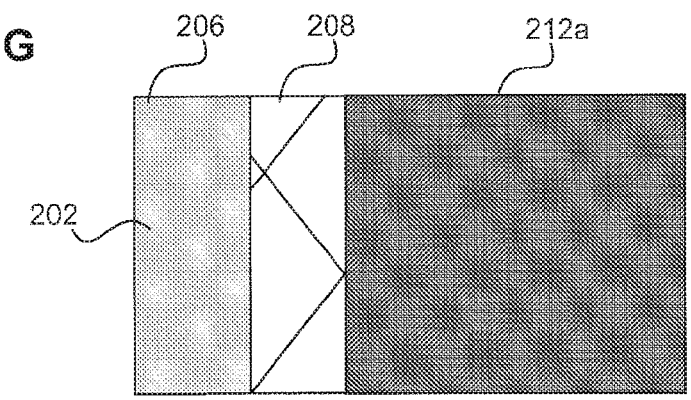

In the embodiment described above, polishing/removing portions of the conductive sacrificial layer, the conductor, and the barrier layer can result in the formation of an interconnect structure resembling a convex or domed surface, where an angle of the surface of the conductor inside the cavity is greater than zero with respect to the top surface of the substrate. However, in some embodiments, polishing/removing the conductor can result in the ideal flat or co-planar interconnect structure. FIGS. 2F and 2G illustrate the method step of removing portions of the conductive sacrificial layer, the conductor, and the barrier layer from the top surface of the substrate until the conductor inside the cavity is angled equal to zero with respect to the top surface, or alternatively, until the conductor inside the cavity comprises a planar surface that is coplanar with the top surface of the substrate. This method step results in a semiconductor structure that comprises a substrate and an interconnect structure disposed on the substrate, where the interconnect structure has a top planar surface that is coplanar with the substrate.

FIG. 2F shows interconnect structures 212a, 212b, and 212c having top surfaces that are co-planar or substantially co-planar with top surface 206 of the substrate 202, and FIG. 2G illustrates a close up view of interconnect structure 212a and its flat top surface.

FIGS. 3A-3E illustrate methods for forming semiconductor devices 300 with TSV structures having flat/co-planar top surfaces, or alternatively, having top surfaces that are angled upwards greater than or equal to zero with respect to the top surface of the substrate. The method steps for forming these TSV structures are substantially similar to the method steps described above in FIGS. 2A-2G.

Figure 3A:
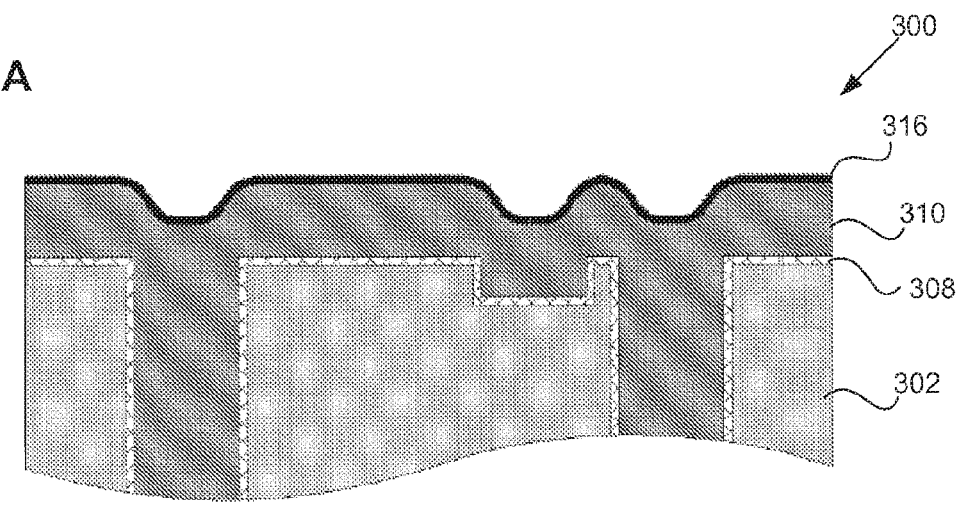
FIGS. 3A-3E illustrate yet another method of forming a semiconductor interconnect structure.
Figure 3B:
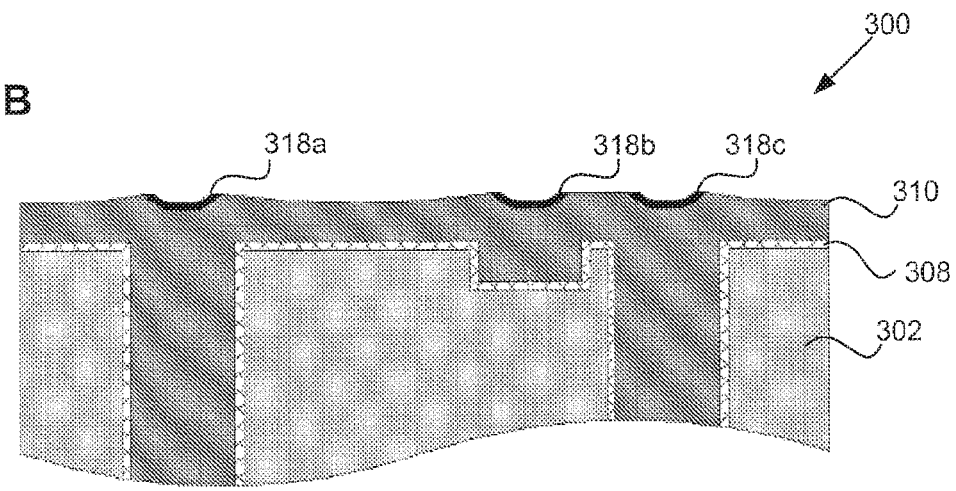
Figure 3C:
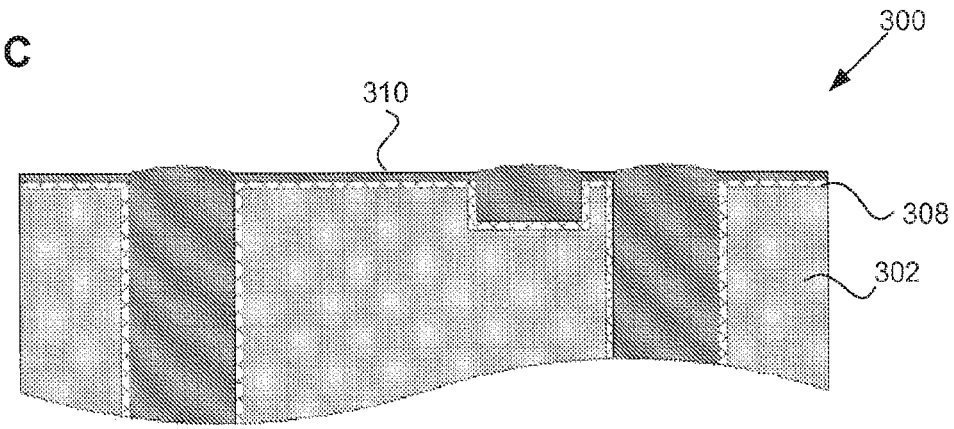
Figure 3D:
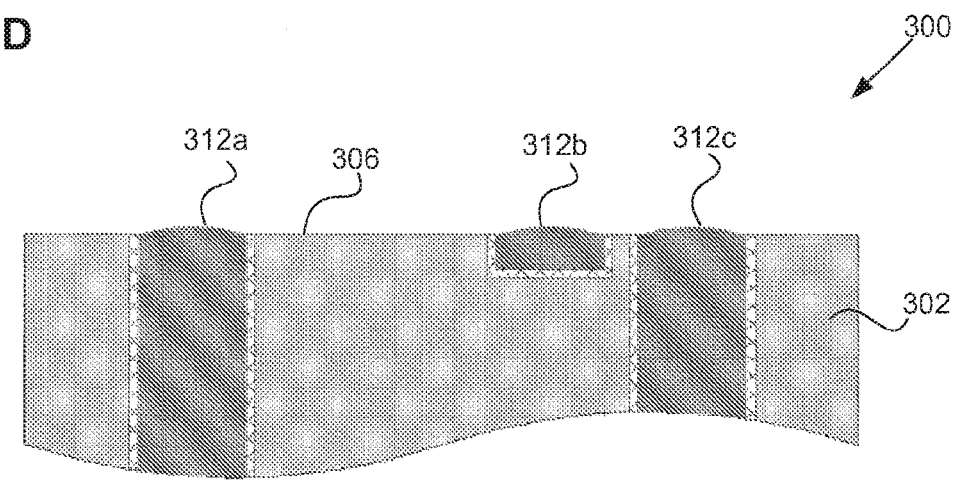
Figure 3E:
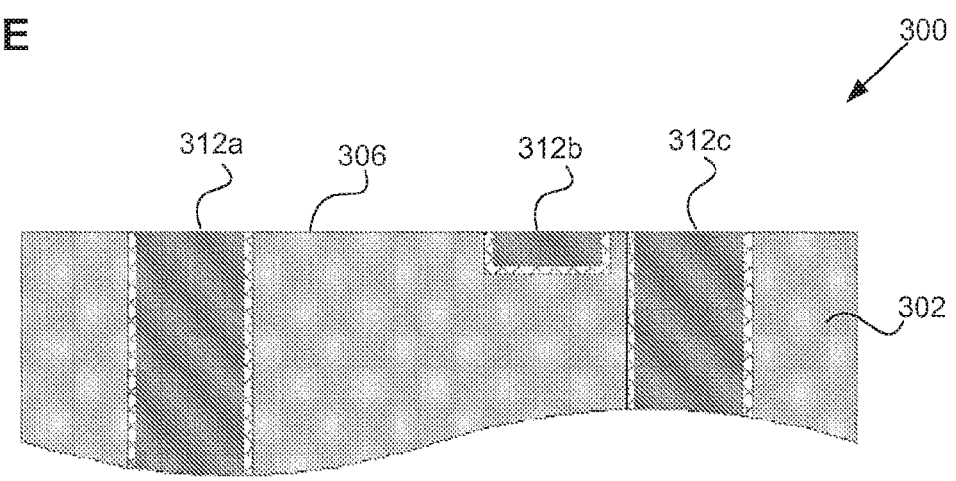

Referring to FIG. 3A, a substrate 302 includes a barrier/seed layer, adhesion layer or coupling layer 308, a conductor 310, and a conductive sacrificial layer 316 disposed on the conductor. In FIG. 3B, a portion of the conductive sacrificial layer and the conductor have been polished/removed, leaving only portions 318a, 318b, and 318c of conductive sacrificial layer remaining. In FIG. 3C, further polishing/removal of the conductive sacrificial layer and the conductor has left only a thin layer of conductor over the barrier/seed layer, as well as slightly domed surfaces over the cavities. Further polishing/removal of the conductor and barrier/seed layer can result in the domed interconnect structures 312a, 312b, and 312c with top surfaces angled at greater than zero with respect to the top surface 306 of the substrate, as shown in FIG. 3D, or alternatively, can result in the domed interconnect structures 312a, 312b, and 312c with flat or co-planar top surfaces, as shown in FIG. 3E. The interconnect structures formed and illustrated in FIGS. 3D-3E can be any type of TSV interconnect structure. Additionally, the methods described herein can be used with any of the interconnect structures described in U.S. application Ser. Nos. 12/221,204, or 12/646,836, both of which are incorporated herein by reference.

In some embodiments of the invention described above, the interconnect structures manufactured with the methods described herein form a metal level within a substrate. In other embodiments, the interconnect structures form a via level within a substrate.

In some embodiments, the pattern substrate herein known as the first material, is coated with a second material and the second material may be a coupling layer or an adhesive layer or a barrier/seed layer or their various combinations. The third material coated over the second material and may fill or overfill the cavities in the first material. A fourth material deposited by wet deposition methods such as electroless or electrolytic film may be coated over the third material. The removal rate of the fourth material been less than that of the third material and during the planarization step to remove unwanted materials, the presence of the fourth material cause a substantial co-planar topography across the substrate.

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

The invention claimed is:

1. A method for fabricating an apparatus comprising one or more semiconductor devices, the method comprising:
    (a) obtaining a substrate comprising one or more holes in a top surface of the substrate, each said hole comprising at least one of a through-hole and a recess;
    (b) obtaining a first structure comprising the substrate and also comprising a conductive layer of a first material, the conductive layer covering the substrate and extending into each said hole to provide in each said hole at least a part of an interconnect structure in the apparatus, a top surface of the conductive layer having a protrusion over each said hole, wherein over each said hole, the corresponding protrusion extends upward from an adjacent area of the top surface of the conductive layer, the adjacent area laterally surrounding a top of the protrusion; and
    (c) polishing a top surface of the first structure at least until the top surface is planar and the conductive layer is completely removed adjacent each said hole.

2. The method of claim 1 wherein each said protrusion is convex.

3. The method of claim 1 wherein the polishing comprises a stage at which the conductive layer is completely removed adjacent each said hole and forms a protrusion at the top surface of the first structure over each said hole.

4. The method of claim 3 wherein at said stage, each said protrusion is convex.

5. The method of claim 1 wherein operation (b) comprises:
    (b1) forming a first layer covering the substrate, the first layer comprising a layer of the first material; and then
    (b2) polishing the first layer until the first structure is obtained.

6. The method of claim 5 wherein polishing the first layer comprises polishing the layer of the first material to remove a part of the layer of the first material, a remaining part of the layer of the first material being said conductive layer.

7. The method of claim 5 wherein at an end of operation (b2), the layer of the first material has a recess over each said hole.

8. The method of claim 1 wherein obtaining the first structure comprises forming a barrier layer over the substrate and in each said hole prior to forming the conductive layer;
    wherein the polishing comprises completely removing the barrier layer adjacent each said hole.

9. The method of claim 8 wherein the polishing comprises a stage at which both the conductive layer and the barrier layer are completely removed adjacent each said hole, and the conductive layer forms a protrusion at the top surface of the structure over each said hole.

10. The method of claim 1 wherein the one or more holes are a plurality of the holes.

11. The method of claim 1 wherein the first material comprises copper.

12. The method of claim 1 wherein forming the conductive layer comprises electro-deposition of the first material.

13. The method of claim 1 wherein the polishing comprises chemical mechanical polishing.

14. The method of claim 1 wherein the polishing comprises electro-chemical mechanical polishing.

15. The method of claim 1 wherein the substrate is a silicon wafer.

16. A method for fabricating an apparatus comprising one or more semiconductor devices, the method comprising:
    (a) obtaining a substrate comprising one or more holes in a top surface of the substrate, each said hole comprising at least one of a through-hole and a recess;
    (b) obtaining a first structure comprising the substrate and also comprising a conductive layer of a first material, the conductive layer covering the substrate and extending into each said hole to provide in each said hole at least a part of an interconnect structure in the apparatus, a top surface of the conductive layer having a protrusion over each said hole, wherein over each said hole, the corresponding protrusion extends upward from an adjacent area of the top surface of the conductive layer, the adjacent area laterally surrounding a top of the protrusion; and (c) polishing a top surface of the first structure at least until the top surface is planar and the conductive layer is completely removed around each said hole.

17. The method of claim 16 wherein each said protrusion is convex.

18. The method of claim 16 wherein the polishing comprises a stage at which the conductive layer is completely removed around each said hole and forms a protrusion at the top surface of the first structure over each said hole.

19. The method of claim 18 wherein at said stage, each said protrusion is convex.

20. The method of claim 16 wherein operation (b) comprises:
 (b1) forming a first layer covering the substrate, the first layer comprising a layer of the first material; and then
 (b2) polishing the first layer to remove a part of the layer of the first material, a remaining part of the layer of the first material being said conductive layer;
 wherein at a start of operation (b2), the layer of the first material has a recess over each said hole.

21. The method of claim 1 wherein the operation (b) comprises thermal treatment of the first material of the conductive layer, the thermal treatment changing a grain size of the first material of the conductive layer.

22. The method of claim 21 wherein the first material is metal.

23. The method of claim 21 wherein the first material is copper.

* * * * *

UNITED STATES PATENT AND TRADEMARK OFFICE
CERTIFICATE OF CORRECTION

Page 1 of 1

PATENT NO. : 9,812,360 B2
APPLICATION NO. : 15/391393
DATED : November 7, 2017
INVENTOR(S) : Cyprian Uzoh, Vage Oganesian and Ilyas Mohammed It is certified that error appears in the above-identified patent and that said Letters Patent is hereby corrected as shown below:

In the Specification

In Column 5, Line 60: replace "FIG. 213" with -- FIG. 2B --

Signed and Sealed this
Sixth Day of February, 2018

Joseph Matal
*Performing the Functions and Duties of the*
*Under Secretary of Commerce for Intellectual Property and*
*Director of the United States Patent and Trademark Office*